(12) United States Patent
Miyoshi et al.

(10) Patent No.: US 8,139,620 B2
(45) Date of Patent: Mar. 20, 2012

(54) NITRIDE SEMICONDUCTOR LASER DEVICE

(75) Inventors: Takashi Miyoshi, Anan (JP); Takeshi Okada, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/711,795

(22) Filed: Feb. 24, 2010

(65) Prior Publication Data

US 2010/0220760 A1 Sep. 2, 2010

(30) Foreign Application Priority Data

Feb. 27, 2009 (JP) ................................. 2009-045398
Feb. 4, 2010 (JP) ................................. 2010-023003

(51) Int. Cl.
*H01S 5/00* (2006.01)
(52) U.S. Cl. .................................. 372/46.01; 372/43.01
(58) Field of Classification Search ............... 372/43.01, 372/45.01, 46.01
See application file for complete search history.

(56) References Cited

U.S. PATENT DOCUMENTS

| | | | |
|---|---|---|---|
| 6,597,716 B1 | 7/2003 | Takatani | |
| 2003/0048818 A1* | 3/2003 | Takeuchi et al. | ................ 372/36 |
| 2005/0116243 A1* | 6/2005 | Mochida | ........................ 257/98 |
| 2006/0043409 A1* | 3/2006 | Ohmi | ............................ 257/103 |
| 2006/0098704 A1* | 5/2006 | Yamaguchi et al. | ....... 372/43.01 |
| 2006/0109881 A1* | 5/2006 | Kwak et al. | ............... 372/43.01 |

FOREIGN PATENT DOCUMENTS

| | | |
|---|---|---|
| JP | H09-283845 A | 10/1997 |
| JP | H10-270792 A | 10/1998 |
| JP | 2000-12970 A | 1/2000 |

* cited by examiner

*Primary Examiner* — Jessica Stultz
*Assistant Examiner* — Phillip Nguyen
(74) *Attorney, Agent, or Firm* — Global IP Counselors, LLP (57) ABSTRACT

The nitride semiconductor laser device includes a substrate, a nitride semiconductor layer having a first nitride semiconductor layer, an active layer, and a second nitride semiconductor layer stacked in this order on the substrate, and a ridge provided on a surface of the nitride semiconductor layer. The surface of the nitride semiconductor layer includes a generally flat part and first and second grooves which extend along the ridge in a resonator direction, the first groove being formed continuous to a first side surface of the ridge, the second groove being formed continuous to a second side surface of the ridge which is opposite to the first side surface.

16 Claims, 2 Drawing Sheets

NITRIDE SEMICONDUCTOR LASER DEVICE

CROSS-REFERENCE TO THE RELATED APPLICATIONS

This application claims priority to Japanese Patent Application Nos. 2009-45398 and 2010-23003 filed on Feb. 27, 2009 and Feb. 4, 2010 respectively. The entire disclosures of Japanese Patent Application Nos. 2009-45398 and 2010-23003 are hereby incorporated herein by reference.

BACKGROUND OF THE INVENTION

1. Field of the Invention

The present invention relates to a nitride semiconductor laser device, and more particularly relates to a nitride semiconductor laser device having a ridge waveguide structure.

2. Description of the Related Art

A nitride semiconductor is made of a compound semiconductor including $In_xAl_yGa_{1-x-y}N$ ($0 \leq x$, $0 \leq y$, $0 \leq x+y \leq 1$), and requirements for a laser device using such a nitride semiconductor is increasing, for use in optical disc systems capable of recording and reproducing large-volume, high-density information such as a next-generation DVD, and for use in electric appliances such as personal computers. Consequently, studies on semiconductor laser devices using a nitride semiconductor have been vigorously conducted. Also, a semiconductor laser device using a nitride semiconductor is expected to emit light over a wide range of wavelengths of visible light, from ultraviolet region to red, and therefore a wide variety of application areas are expected, including laser printers, laser displays, and light source of optical networks.

Particularly, various studies have been conducted on the structure of nitride semiconductor laser devices and structures which allow favorable lateral mode control, on the structures and the like for low power consumption, high output power, high reliability, small size, long operating life and so fourth. Of these, a structure which holds particular promise is one with a ridge waveguide structure. In a nitride semiconductor laser device having a ridge waveguide structure, a ridge is provided to control the lateral confinement of light, and a protective film for electric current constriction and light confinement is formed on the side surfaces of the ridge and the surfaces of the nitride semiconductor layer at both sides of the ridge. Japanese Patent Publication Nos. JP H09-283845A, JP H10-270792A, and JP 2000-12970A disclose such nitride semiconductor laser device, for example.

However, lateral confinement of light in a ridge waveguide type laser device depends on various factors such as the width and depth of the ridge, a material of the protective film etc. Optical confinement is easily affected by the factors other than those to be taken into consideration in the design of the devices, by the factors that may change over time such as adhesion between nitride semiconductor layer and protective film, and controlling the optical confinement has been difficult. That is, even if a protective film having good adhesion with the nitride semiconductor layer is selected, the optical confinement may not be so good. Also, even if a ridge is formed and a protective film is selected in consideration of the refractive index with the nitride semiconductor layer, the protective may not necessarily have good adhesion with the nitride semiconductor layer. Therefore, it is necessary to form a nitride semiconductor laser device with a structure capable of maintaining good performance for long time in terms of both the optical confinement and the adhesion.

SUMMARY OF THE INVENTION

The present invention was conceived in view of the above circumstances, and an object of the present invention is to provide a nitride semiconductor laser device of a low threshold and having a long operating life in which good optical confinement is attained, adhesion of the protective film to both sides of the ridge is secured, the optical output power versus input current is improved.

A nitride semiconductor laser device according to one aspect of the invention includes a substrate, a nitride semiconductor layer having a first nitride semiconductor layer, an active layer, and a second nitride semiconductor layer stacked in this order on the substrate, and a ridge formed on a surface of the nitride semiconductor layer. The surface of the nitride semiconductor layer includes a generally flat part and first and second grooves which extend along the ridge in a resonator direction the first groove is formed continuous to a first side surface of the ridge, the second groove is formed continuous to a second side surface of the ridge which is opposite to the first side surface. A width of each of the first and second grooves is preferably less than a width of the ridge. A width of each of the first and second grooves is preferably larger than a depth from the generally flat part of the surface of the nitride semiconductor layer to a bottom surface of each of the first and second grooves. A bottom surface of each of the first and second grooves is preferably positioned in the second nitride semiconductor layer. The active layer preferably has a quantum well structure, and a bottom surface of each of the first and second grooves is preferably positioned in a layer being in contact with a second nitride semiconductor layer side of a well layer. A side surface of each of the first and second grooves which faces the ridge preferably has an inclination angle smaller than an inclination angle of each of the first and second side surfaces of the ridge with respect to the generally flat part of the surface of the nitride semiconductor layer. An insulating film is preferably formed on the surface of the second nitride semiconductor layer and on the first and second side surfaces of the ridge with a thickness of the insulating film being smaller on the first and second grooves than on the generally flat part of the surface of the nitride semiconductor layer. An insulating film is preferably formed on the surface of the second nitride semiconductor layer and on the first and second side surfaces of the ridge, with a thickness of the insulating film on each of the first and second grooves is larger than a depth from the generally flat part of the surface of the nitride semiconductor layer to a bottom surface of each of the first and second grooves. A width of each of the first and second grooves is preferably from 0.5 to 5 μm and a depth of each of the first and second grooves is from 10 to 100 nm. An insulating film is preferably formed on the surface of the second nitride semiconductor layer and on the first and second side surfaces of the ridge with the largest thickness of the insulating film being from 50 to 400 nm, and a thickness of the insulating film over each of the first and second grooves being from 40 to 300 nm.

The above aspects of the present invention can provide a nitride semiconductor laser device of a low threshold and having a long operating life in which good optical confinement is attained, adhesion of the protective film to both sides of the ridge is secured, the optical output power versus input current is improved.

DETAILED DESCRIPTION OF THE PREFERABLE EMBODIMENTS

Figure 1A:
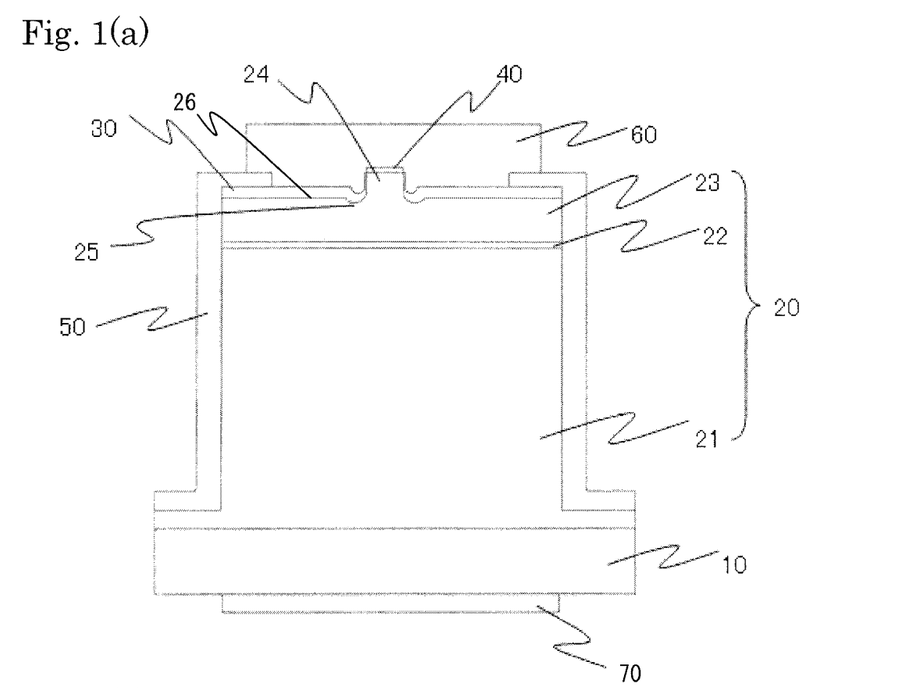
FIG. 1(a) is a schematic cross sectional view of a nitride semiconductor laser device according to an embodiment of the present invention.
Figure 1B:
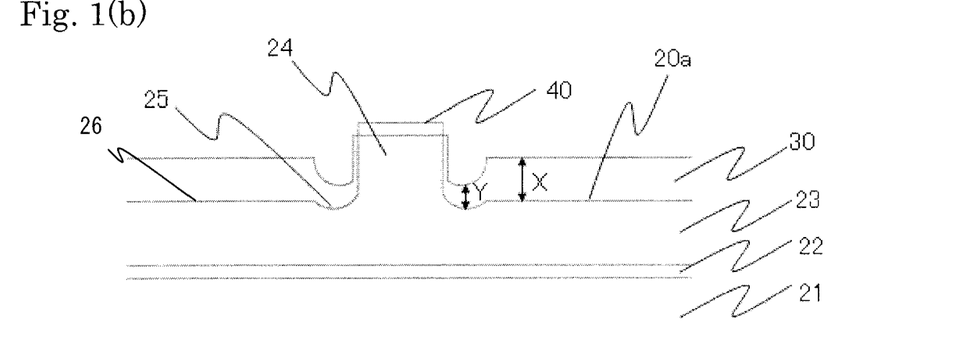
FIG. 1(b) is an enlarged schematic cross sectional view of a part thereof.

As exemplified in FIGS. 1(a) and 1(b), a nitride semiconductor laser device of the embodiment includes on a substrate 10 having two main surfaces, a first main surface and a second main surface, a first nitride semiconductor layer 21, an active layer 22, and a second nitride semiconductor layer 23 formed in this order as a nitride semiconductor layer 20. A ridge 24 is formed on the surface of the nitride semiconductor layer 20 and a groove 25 having a side surface continuous to a side surface of the ridge is formed continuously in the resonator direction on the surface of the nitride semiconductor layer at both sides of the ridge. In the example illustrated in FIG. 1(a), the resonator direction is the normal direction to a plane of paper of the drawing. The nitride semiconductor layer 20 has a generally flat part 26 on its surface. Also, an insulating film 30 is formed from the side surface of the ridge to the surface of the nitride semiconductor layer 20a. A p-side electrode 40 is formed on the ridge 24. An n-side electrode 70 is formed on the second main surface side of the substrate 10. A protective film 50 for protecting the nitride semiconductor layer is formed from the side surface to the upper surface of the nitride semiconductor layer. A p-side pad electrode 60 is formed above the insulating film 30, the p-side electrode 40, and the protective film 50.

The nitride semiconductor laser device of the embodiment may be a device capable of emitting laser beam having a wavelength of about 400 nm or less, but is particularly effective when the device is capable of emitting laser beam having a wavelength of about 440 nm or more. In order to obtain a relatively long emission wavelength of about 440 nm or more, a high mixed crystal of In is needed to be introduced into the active layer. For example, if a longer wavelength is obtained by introducing high mixed crystal InGaN into the active layer, the difference in the refractive index with AlGaN which is typically employed as a cladding layer decreases, so that a sufficient optical confinement index may be difficult to obtain. However, according to the present invention, sufficient optical confinement can be obtained by providing a groove which is continuous in the resonator direction to both sides of the ridge, and lasing in the long wavelength region can be achieved.

The nitride semiconductor layer 20 may include a layer having a general formula of $In_xAl_yGa_{1-x-y}N$ ($0 \leq x \leq 1$, $0 \leq y \leq 1$, $0 \leq x+y \leq 1$). In addition to this, a nitride semiconductor layer which is partially substituted with B as a group III element, or a part of N as a Group V element is substituted by P or As may be used. The n-side semiconductor layer may be doped with at least one n-type impurity of group IV elements or group VI elements or the like, such as Si, Ge, Sn, S, O, Ti, Zr, and Cd. The p-side semiconductor layer may be doped with a p-type impurity, such as Mg, Zn, Be, Mn, Ca, Sr, or the like. The impurity is preferably contained in a concentration region of, for example, about $5 \times 10^{16}/cm^3$ to $1 \times 10^{21}/cm^3$. The first nitride semiconductor layer 21 and the second nitride semiconductor layer 23 mean either of one is of an n-type and the other is of a p-type. In the present embodiments, the first nitride semiconductor layer may be described as the n-side semiconductor layer, and the second nitride semiconductor layer may be described as the p-side semiconductor layer.

The active layer 22 may be either of a multiquantum well structure or a single quantum well structure. The nitride semiconductor layer may have a SCH (Separate Confinement Heterostructure) in which the active layer is interposed between the optical waveguides provided at the n-side semiconductor layer and the p-side semiconductor layer which constitute an optical guide layer. The present invention is not limited by these structures.

Growth method of the nitride semiconductor is not particularly limited and any method known as a growth method of nitride semiconductor such as MOCVD (Metal Organic Chemical Vapor Deposition), HVPE (Hydride Vapor Phase Epitaxy), MBE (Molecular Beam Epitaxy), and so on, can be employed. Particularly, MOCVD and MBE are preferable because they allow a growth with good crystallinity.

A ridge 24 is formed on the nitride semiconductor layer, that is, on the surface of the p-side semiconductor layer. The ridge functions as an optical waveguide. The width of the ridge is preferably about 1.0 μm to about 30.0 μm, and further in a case of obtaining a single mode laser beam, the width thereof is preferably about 1.0 μm to about 3.0 μm. The height of the ridge (the etching depth) may be suitably adjusted according to the thickness and material of a layer constituting p-side semiconductor layer, degree of optical confinement and the like, and is, for example, 0.1 to 2 μm. In the present specification, the height of the ridge refers to the height from the upper surface of the generally flat part of the nitride semiconductor layer to the upper surface of the ridge. The ridge is preferably set so that the length in the resonator direction is about 100 μm to about 2000 μm. The width is not required to be constant along the resonator direction, and the side surfaces thereof may be either vertical or tapered. In this case, the angle of taper can suitably be about 45° to about 90°C.

The ridge can be formed by using any methods common in the art. Examples include photolithography and etching. In this case, the etching may either be dry etching (such as RIE) or wet etching, or the both may be performed in this order or reversed order.

A pair of grooves 25 (first and second grooves) is formed on the nitride semiconductor layer surfaces respectively at both sides of the ridge. The grooves 25 continuously extend in the resonator direction, and each of the grooves 25 has a side surface which is continuous to a side surface of the ridge. That is, the grooves are formed in contact with the ridge so that the lower portion of the ridge is interposed between the two grooves 25. Also, it is preferable that the ridge and the grooves are formed without having a step therebetween (i.e., the side surface of the ridge and the side surface of the groove are substantially flush). Optical confinement in the lateral direction can be obtained more effectively by providing such a groove at both sides of the ridge. That is, in addition to the optical confinement obtained by the ridge, forming a groove having an auxiliary optical confinement function at both sides of the ridge allows further concentration of lateral light confined in the ridge to the region under the ridge. Also, adhesion between the nitride semiconductor layer and the insulating layer, which will be described later, can be improved.

Also, as described above, controlling of the shape of the ridge is one of the factors to obtain a desired degree of optical confinement in a laser device of ridge waveguide type. However, forming a ridge by usual etching may result in damage to the crystal of the nitride semiconductor layer. With this, leakage of current via dislocations and/or growth defects may occur at the surface of the nitride semiconductor layer etc., and as a result, a laser device having stable characteristics may not be obtained. According to the present invention, optical confinement is enhanced by providing a groove in a part of the region on the surface of the nitride semiconductor layer, so that the leak current can be more suppressed than in a case where the height of the ridge is increased by generally removing the nitride part of the semiconductor layer, and thus can contribute to improve the reliability of the nitride semiconductor laser devices.

Figure 4:
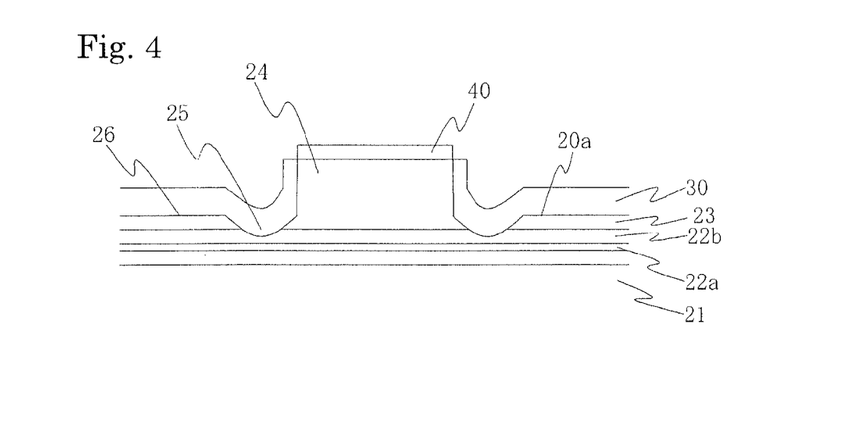

The depth of the grooves is preferably such that the bottom surface of the grooves is positioned in the second nitride semiconductor layer. With this arrangement, lateral optical confinement can be achieved while reliably suppressing the leak current around the ridge even when the grooves are formed deeply, so that a low threshold current and a high luminous efficiency can be achieved. Also, it is preferable that when the bottom surface of the grooves is positioned in the layer $22b$ which is in contact with the well layer $22a$ of the second nitride semiconductor layer side as shown in FIG. 4, lateral optical confinement can be further enhanced. This is because when the bottom surface of the grooves is positioned in the layer which is in contact with the well layer at which light emission occurs, the difference in the refractive index with the both sides of the ridge can be set more directly. In this case, the thickness of the layer which is in contact with the well layer of the second nitride semiconductor layer side is preferably about 40 nm to about 100 nm. This is effective for vertical optical confinement. If a plurality of well layers is provided, the bottom surface of the grooves is preferably positioned in the layer which is in contact with the second nitride semiconductor layer side of the well layer which is closest to the second nitride semiconductor layer. Specifically, the depth of the grooves is preferably about 10 nm to about 100 nm. Also, the depth thereof is preferably about 1% to about 10% with respect to the height of the ridge. In each case, the distance between the bottom surface of the grooves and the well layer is preferably at least 10 nm in order to prevent leak current.

The width of the grooves is preferably less than the width of the ridge. With this arrangement, leak current from the bottom surface of the grooves to the active layer, particularly to the well layer can be reduced. Leak current tends to increase in proportion to the etched surface area, and therefore, wider the width of the grooves, the leak current more likely to occur. Although the detail will be described later, the arrangement above is also effective to improve the adhesion with the insulating film. Specifically, the largest width is preferably about 0.5 μm to about 5 μm. The grooves may have different width at the opening side and the bottom side. Preferably, the grooves are formed to be narrower at its bottom side. This arrangement facilitates formation of the insulating film. The grooves preferably have approximately the same width in the resonator direction. With this, the degree of the optical confinement in the resonator direction can be adjusted, so that stable optical confinement can be performed which contributes to have stable beam shape.

Figure 2:
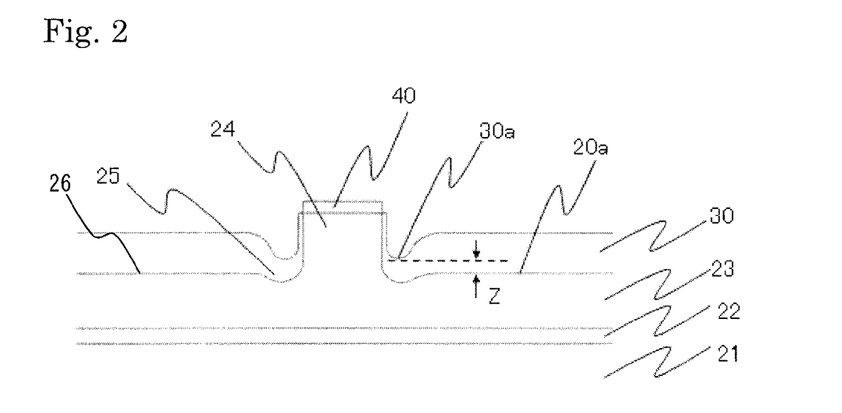
FIG. 2 is an enlarged schematic cross sectional view of a part of a nitride semiconductor laser device according to another embodiment of the present invention.
Figure 3:
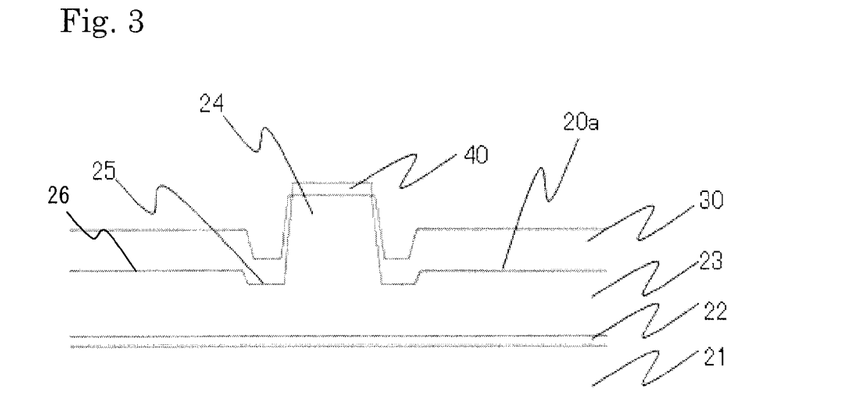
FIG. 3 is an enlarged schematic cross sectional view of a part of a nitride semiconductor laser device according to another embodiment of the present invention.

The shape of the grooves is not specifically limited but it is preferable that the width of the grooves is larger than the depth from the generally flat part of the top surface of the nitride semiconductor layer to the bottom surface of the grooves, that is, the grooves are laterally long. It is preferable that with such laterally long grooves, efficient optical confinement can be achieved and a desired insulating film can be reliably formed in the grooves. Examples of the shape of the grooves include a shape in which a groove is entirely made up of curved surfaces as shown in FIG. 2, a shape whose cross section is rectangular as shown in FIG. 3, and a shape whose bottom surface is made up of a curved surface as shown in FIG 1. It is preferable that, as shown in FIGS. 1 and 2, the insulating film can be prevented from detaching from the corners of the grooves when the grooves are made up of curved surfaces and adhesion thereof can be improved. Particularly, as shown in FIG. 2, a side surface of the grooves which is opposite a side surface of the ridge is preferably formed with a smaller inclination than the side surface of the ridge. With this arrangement, an abrupt change in the refractive index in the lateral direction can be prevented, so that it makes the optical confinement relatively easy to control.

The grooves can be formed by using any methods commonly employed in processing nitride semiconductors. Examples include photolithography and etching. In this case, the etching may either be dry etching (such as RIE) or wet etching, or the both may be performed in this order or reversed order. Among those, photolithography and RIE using a mask pattern such as $SiO_2$, SiN, and a resist is preferably employed. The shape of the grooves can be made by appropriately adjusting the material, shape, and thickness of the mask pattern; the type, temperature, and flow rate of the etching gas, etching time; and RF electric power etc. For example, in forming a groove in a rectangular shape as shown in FIG. 3, etching is performed at a relatively high RF power. In forming a groove having a curved surface in the vicinity of its bottom portion as shown in FIG. 1, etching may be performed at a relatively low RF power, or by using an ICP (Inductively Coupled Plasma) apparatus. When the grooves are formed by using this method, the groove forming step can be carried out either before or after the ridge forming step. The grooves according to the present invention are formed continuously in the resonator direction and have a side surface continuous from a side surface of the ridge, so that the grooves can also be formed in a series of steps of forming the ridge. That is, the grooves can be formed by performing etching either before or after forming the ridge, under predetermined conditions using the mask for forming the ridge. The grooves may be formed shallower than the desired depth before forming the ridge and is made deeper to complete at the same time the ridge is formed. It is preferable that with the methods described above, the grooves entirely made up of curved surfaces as shown in FIG. 2 can be formed by using a simple method. Specifically, the above can be carried out by appropriately adjusting the type, temperature, and flow rate of the etching gas, and etching time etc. For example, if the grooves are formed after forming the ridge, the grooves can be formed such that a mask pattern for forming the ridge is disposed and etching is carried out, then, the etching pressure is increased and/or the RF power is increased and etching is carried out on both sides of the nitride semiconductor layer to form the grooves. Particularly, it is preferable that the grooves are formed before forming the ridge. The grooves can be formed such that a mask pattern for forming the ridge is disposed and etching is carried out preferentially on the nitride semiconductor layer at both sides of the ridge to form the grooves. The etching pressure is decreased and/or the RF power is decreased and etching is carried out to form the ridge and further deepen the grooves, and thus the ridge and the grooves are formed. With this method, grooves of desired shape can be reliably formed.

An insulating film 30 is also called an embedded film, and is usually formed over the surface of the nitride semiconductor layer and/or the side surfaces of the ridge. That is, it is formed on the nitride semiconductor layer, in a region other than the region where the nitride semiconductor layer is in direct contact with the electrode, and thereby electrically connected. The term "insulating" here means that current can flow selectively from a contact region between the nitride semiconductor region constituting the ridge and the electrode during operation of the nitride semiconductor laser device. The insulating film may be one that conducts current to the extent of not causing short circuit.

An insulating film is generally made of an insulating material having smaller refractive index than that of the nitride semiconductor layer. More specifically, the refractive index of 2.4 or less is suitable. The refractive index can be measured with a spectral ellipsometer that makes use of ellipsometry, in specific, by using HS-190 manufactured by J. A. Woollam Co., for example.

The insulating film may be selected from the group including oxides, nitrides, oxide-nitrides, and the like of Zr, Si, V, Nb, Hf, Ta, Al, Ce, In, Sb, Zn, and the like. More specifically, it is preferably made of a material including at least one of $SiO_2$, $ZrO_2$, $Al_2O_3$, AlN, and SiN. When the insulating film is formed from the side surface of the ridge to the surfaces of the nitride semiconductor layer 20a with such a material, a reliable difference in the refractive index with respect to the nitride semiconductor layer, particularly to the p-side semiconductor layer can be obtained, and leakage of light from the active layer can be controlled. Also, efficient optical confinement in the ridge can be achieved and reliable electrical insulation near the bottom portion of the ridge can be obtained, so that generation of leak current can be avoided.

In order to obtain such effects efficiently, good adhesion to the portion near the ridge is also needed without exerting stress thereon. For this, it is necessary to reduce the stress and ensure the adhesion between the ridge and the insulating film on both sides of the ridge, and thereby prevent cracking of the nitride semiconductor layer and detachment of the insulating film. According to the embodiment, the insulating film is formed over from the side surfaces of the ridge to the surfaces of the nitride semiconductor at both sides of the ridge, and further over the grooves, and therefore it is possible to suppress the stress that is generated by a difference in the thermal expansion coefficient and in the lattice constants between the nitride semiconductor layer and the insulating film. That is, if such a groove as in the embodiment is not provided and the insulating film is formed over the side surfaces of the ridge and the flat surface of the nitride semiconductor layer, detachment of the insulating film from the side surfaces of the ridge and/or the bottom portion of the ridge may occur. In such a case, if the thickness of the insulating film is reduced to ease the stress between the insulating film and the nitride semiconductor, it may become difficult to maintain the insulation so that electric current can not be constricted in the ridge, and as a result, the laser oscillation becomes difficult to obtain. On the other hand, if a desired film thickness is made, cracks may occur in the insulating film and the nitride semiconductor layer, and deterioration of the nitride semiconductor laser device may be increased. As in the embodiment, by forming an insulating film over the grooves, stress imposed on the side surfaces of the ridge can be released to the outside of the ridge, so that deterioration of insulation and detachment of the insulation film at the side surfaces and the bottom portion of the ridge can be prevented, and generation of crystal defects in the ridge and the nitride semiconductor layer can be prevented.

The insulating film preferably has, as shown in FIG. 1(b), a smaller film thickness Y over the grooves than the film thickness X over the nitride semiconductor layer. With this arrangement, the stress in the insulating film can be reduced efficiently. As described above, the stress in the vicinity of the ridge can be reduced by forming an insulating film over the grooves. However, when the insulating film is formed thicker to obtain desired difference in the refractive index, problems such as detachment of the insulating film and generation of cracks may still occur. In such a case, when the insulating film is formed with a smaller film thickness over the insulating film and a larger thickness over the surface of the nitride semiconductor layer, the stress can be reduced at the periphery of the ridge, and at the same time, the peripheral portion of the ridge can be pressed from the sides thereof at the surface of the nitride semiconductor layer which locates higher than the bottom surfaces of the grooves, and further, a desired film thickness can be secured. Thus, the difference in the refractive index and the insulation properties can be maintained. In order to reduce the stress more effectively, it is preferable that the film thickness of the insulating film over the grooves is larger than the depth from the upper surface of the nitride semiconductor layer to the bottom surface of the grooves, that is, as shown in FIG. 2, the surface 30a of the insulating layer is at a higher position than the surface 20a of the nitride semiconductor layer over the grooves (see the part Z in FIG. 2). With this arrangement, the distance between the electrode and the nitride semiconductor layer can be increased so that optical absorption by the electrode can also be suppressed. If the surface of the insulating film over the grooves is at a position lower than the surface of the nitride semiconductor layer, the p-side electrode or the pad electrode will be buried into the grooves. As a result, the loss increases, causing an increase of the threshold value and a decrease in slope efficiency. Such an effect can be obtained when the thickness of the insulating film over the grooves is 90% or less of the thickness of the insulating film over the nitride semiconductor layer, and it is further preferable when the thickness thereof is about 80% or less.

For example, the insulating film preferably has a thickness about 50 nm to about 400 nm over the surface of the nitride semiconductor layer. When the thickness of the insulating film described above is 100 nm or more, it is more efficient in optical confinement, and at the same time, optical absorption by the electrode can be suppressed. When the thickness of the insulating film described above is 400 nm or less, detachment and/or cracking of the insulating film caused by the stress can be prevented. More specifically, it is preferable when it is formed with a thickness of about 50 nm to about 400 nm over the nitride semiconductor layer and of at least about 40 nm over the grooves, the insulation properties can be secured. It is preferable that it is formed about 40 nm to about 300 nm.

A nitride semiconductor laser device has a structure in which electric current and light are constricted in the active layer which is directly below the ridge, so that heat generation is most likely to occur. However, in the present invention, the grooves are provided at both sides of the ridge, so that the heat dissipation path from the heat generation portion to outside of the device can be shortened and deterioration of the device due to the heat can be prevented. Also, the thickness of the insulating film is thinner over the grooves than over the surface of the nitride semiconductor layer. Therefore, heat dissipation to the electrode (pad electrode) formed over the nitride semiconductor layer via the insulating film can be smoothly carried out.

In the present invention, whether the insulation film entirely covers the side surfaces of the ridge or not is not limited, but it is preferable that the side surfaces of the ridge are covered. Also, the insulating film is preferably has a smaller thickness over the side surfaces of the ridge than over the nitride semiconductor layer and the grooves. The insulating film is formed over the side surfaces of the ridge and the surface of the nitride semiconductor layer, so that a difference in the thickness of the insulating film formed over both sides may occur. For example, the ratio of the thickness of the insulation film over the surface of the nitride semiconductor layer to the thickness of the insulation film over the side surfaces of the ridge may be about 1-2:1, preferably about 2:1. That is, the thickness of the insulating film over the side surfaces of the ridge may be about a half of the thickness of the insulating film over the surface of the nitride semiconductor layer. Examples thereof include about 30 nm to about 250 nm.

The insulating film can be formed by any method known in the art. For example, various methods can be used, such as vapor deposition, sputtering, reactive sputtering, ECR plasma sputtering, magnetron sputtering, ion beam assist deposition, ion plating, laser ablation, CVD, spraying, spin coating, dipping, a combination of these 2 or more methods, a combination of these methods and oxidation (thermal treatment), or the like.

There are no particular limitations on the method for forming the insulating film with a small thickness over the grooves. An example thereof is such that firstly an insulating film of predetermined thickness is formed from the side surfaces of the ridge to the surface of the nitride semiconductor layer, and then the thickness thereof is partially reduced along the thickness direction of the insulating film by employing a known photolithography method (such as applying a resist, pre-baking, exposing, developing, and post-baking etc.) and etching (such as wet etching with an alkaline developer or dry etching with a chlorine-based gas), or by subjecting a part of the insulating film which is over the grooves to light exposure, thermal treatment, or the like. The region of smaller thickness may be formed over the grooves in such a manner that, by using known photolithography and etching processes, an insulating film of predetermined thickness is formed only over the surface of the nitride semiconductor layer and then an insulating film made of the same material is stacked over the entire surface including the side surfaces of the ridge, over the grooves and the surface of the nitride semiconductor layer. The region of smaller thickness may also be formed over the grooves by suitably adjusting the factors in forming the insulating layer. More specifically, the above can be carried out by adjusting film deposition pressure, oxygen flow rate, nitrogen flow rate, microwave power, RF power, film deposition rate, and the like. Among those, it is preferable that the insulating film is formed with temporarily reducing the deposition pressure. With this, although the insulating film is formed over the surface of the nitride semiconductor layer, the film deposition rate decreases near the grooves and at the side surfaces of the ridge, so that the thickness of the insulating film can be made relatively small over the grooves. Also, before forming the insulating film, a pre-treatment may be applied locally so that the film quality, thickness, etc. of the insulating film to be obtained can be locally varied. Further, those method described above may be combined suitably.

The insulating film 30 may be made of a plurality of layers. The plurality of layers may be made of different materials or crystallinity. Examples thereof include a multilayer in which a first film of a single crystal and a second film of a polycrystalline or amorphous are formed in this order over the nitride semiconductor layer.

Each of the other components will be described below.

Substrate 10

A material capable of growing a nitride semiconductor thereon can be used as the substrate. Examples thereof include a nitride semiconductor such as GaN, AlN having a main surface of one of C-plane, M-plane, A-plane, R-plane, (11-22) plane and (20-21) plane, sapphire having a main surface of one of C-plane, M-plane, A-plane, R-plane, and a spinel ($MgAl_2O_4$), silicon carbide, silicon, ZnS, ZnO, GaAs, diamond, lithium niobate, neodymium gallate, etc. Also, such a substrate may have an offset angle of from about 0° to about 10° in a first main plane and/or a second main plane. Among those, a nitride semiconductor substrate is preferable, because it allows a nitride semiconductor layer to grow with good crystallinity. The nitride semiconductor substrate can be formed by using a vapor phase growth method such as MOCVD, HYPE, MBE or the like, a hydrothermal synthesis method in which crystals are grown in a supercritical fluid, a high pressure method, a flux method, a melt method, or the like.

Electrode

The electrode in the present invention refers to a pair of electrodes electrically connected to the p-side and n-side nitride semiconductor layers. The connecting region of the nitride semiconductor layer and the p-side electrode is not particularly limited in its location, size, shape or the like, and the connecting region may be a part of the surface of the nitride semiconductor layer, for example, a portion which is approximately whole surface of the upper surface of the striped-shape ridge formed on the surface of the nitride semiconductor layer or a portion from approximately whole surface of the upper surface of the ridge to both sides thereof can be exemplified. It is preferable that the p-side electrode 40 is formed over the nitride semiconductor layer at the surface of the ridge and the n-side electrode 70 is formed over the second main surface of the substrate.

The electrodes may preferably be formed with a monolayer or multilayer film of a metal or metal alloy of palladium, platinum, nickel, gold, titanium, tungsten, cupper, silver, zinc, tin, indium, aluminum, iridium, rhodium, ITO or the like. The thickness of the electrodes can be suitably adjusted by the material or the like, and for example, about 50 nm to about 500 nm is suitable. The electrodes may be formed at least over the p-side and n-side semiconductor layers or substrate, respectively, and further, a single or a plurality of conductive layers such as pad electrodes may be formed thereon.

A protective film 50 is preferably formed over the insulating film. Such a protective film may be formed at least over the insulating film at the surface of the nitride semiconductor layer, and preferably further covers the side surfaces of the nitride semiconductor layer and/or the side surfaces or surface of the substrate, with or without interposing the insulating film. The protective film can be made of a material similar to that exemplified in the insulating film. With this arrangement, not only insulating properties but also reliable protection of the exposed side surfaces or surface of the nitride semiconductor layer can be provided.

A reflective mirror may be formed on the end surfaces of the resonator. The reflective mirror may be formed with such as an oxide film, a nitride film, an oxide-nitride film, or a combination thereof Examples thereof include a dielectric multilayer film made of an oxide film, a nitride film, or the like of $SiO_2$, $ZrO_2$, $TiO_2$, $Al_2O_3$, $Nb_2O_5$, SiN, AlN, SiON, AlON, and the like. The reflective mirror is preferably formed on the light reflecting side and/or light emitting side of the resonator surface, and further preferably formed on the light reflecting side and light emitting side of the resonator surface.

The reflective mirror can be formed with better reproducibility if the resonator surface has been formed by cleavage.

Examples of the nitride semiconductor laser device according to the present invention will be described in detail below with reference to Figures. The present invention is not limited to or by the examples below.

EXAMPLE 1

As shown in FIGS. 1(a) and (b), the nitride semiconductor laser device according to the present example is such that an n-side semiconductor layer 21, an active layer 22, and a p-side semiconductor layer 23 are formed in this order as the nitride semiconductor layer 20 over a substrate 10, and a ridge 24 is formed on the surface of the p-side semiconductor layer 23. A pair of grooves 25 is formed, whose side surfaces are surfaces continuous to side surfaces of the ridge, and an insulating film 30 is formed over from the side surfaces of the ridge 24 and the surface 20a of the nitride semiconductor layer. The bottom surface of the grooves is made with a curved surface and the insulating film is formed with a smaller thickness over the grooves than the surface of the nitride semiconductor layer. A p-side electrode 40 is formed over the ridge 24. An n-side electrode 70 is formed on the second main surface side of the substrate 10. A protective film 50 for protecting the device is formed over from the side surfaces to the upper surface of the nitride semiconductor layer and a p-side pad electrode 60 is formed over the insulating film 30, the p-side electrode 40 and the protective film 50.

Such laser device can be manufactured in the following method. First, a first nitride semiconductor layer is formed on the substrate. A nitride semiconductor substrate 10 containing an n-type impurity and having (0001) as the growth plane of the nitride semiconductor layer is prepared, and $Al_{0.02}Ga_{0.98}N$ doped with Si is grown at 2.0 μm by using trimethyl gallium (TMG), trimethyl aluminum (TMA), and ammonia ($NH_3$) with a silane gas as an impurity gas. Next, using trimethyl indium (TMI), TMG, and ammonia, with a silane gas as an impurity gas, InGaN doped with Si is grown at 150 nm. Then, using TMG, TMA, ammonia, and silane gas, AlGaN doped with Si is grown at 1.0 μm. Next, using TMG, ammonia, and silane gas, GaN doped with Si is grown at 150 nm, and using TMG and ammonia, undoped GaN is grown at 150 nm.

Next, an active layer is formed on the first nitride semiconductor layer. Using TMI, TMG, ammonia and silane gas, $In_{0.04}Ga_{0.96}N$ doped with Si is grown at 210 nm. Then silane gas is stopped, and a barrier layer of undoped GaN is grown at 1 nm. A well layer of $In_{0.2}Ga_{0.8}N$ is grown at 3 nm. Further, a barrier layer of undoped GaN is grown at 14 nm, and a well layer of $In_{0.2}Ga_{0.8}N$ is grown at 3 nm. Next, as a layer in contact with the well layer, $In_{0.04}Ga_{0.96}N$ is grown at 70 nm.

Next, a second nitride semiconductor layer is formed on the active layer. Next, TMI is stopped and TMA and $Cp_2Mg$ are supplied and AlGaN doped with Mg is grown at 10 nm. Then, $Cp_2Mg$ is stopped and undoped AlGaN is grown with a thickness of 150 nm, and using $Cp_2Mg$, AlGaN doped with Mg is grown with a thickness of 150 nm. Next, $Cp_2Mg$ is stopped and TMA is supplied. Undoped $Al_{0.2}Ga_{0.8}N$ is grown at 2.5 nm. Then, $Cp_2Mg$ is supplied and AlGaN doped with Mg is grown at 2.5 nm, and with alternately repeating this, a superlattice layer is grown to the total thickness of 0.45 μm. Next, GaN doped with Mg is grown at 15 nm.

Formation of Ridge 24

The wafer on which the nitride semiconductor layer has grown is taken out of the reaction vessel, and an insulating film made of $SiO_2$ with a stripe shape of 2.0 μm in width is formed via a predetermined mask over the uppermost surface thereof. Then by using the insulating film of $SiO_2$ as a mask, 0.74 μm of etching is carried out by way of RIE (reactive ion etching) and ridge 24 having a stripe shape of 2.0 μm in width is formed.

Formation of Grooves 25

A mask, which is made of resist and has openings at the positions corresponding to the regions for forming the grooves at both sides of the ridge, is prepared. Then, 30 nm of etching is carried out by way of RIE to remove the mask. Accordingly, the grooves 25 which are made up of curved surfaces and has a side surface continuous to a side surface of the ridge is formed at the surface of the nitride semiconductor layer at both sides of the ridge. The bottom surface of the grooves is positioned in the AlGaN layer of 10 nm in thickness which is formed as a second nitride semiconductor layer.

Formation of P-Side Electrode 40

Next, the entire surface of the wafer is covered with a photoresist, and then the photoresist is removed until the insulating layer made of $SiO_2$ over the ridge 24 is exposed. Next, the insulating film made of $SiO_2$ is etched to expose the upper surface of the ridge. Next, a p-side electrode 40 made of Ni(10 nm)/Au(100 nm)/Pt(100 nm) is formed over the entire wafer by sputtering. The p-side electrode 40 is formed over the upper surface of the ridge by removing the photoresist. After forming the p-side electrode, ohmic annealing is carried out.

Formation of Insulating Film 30

Next, an insulating film 30 made of $SiO_2$ is formed by sputtering. After confirming the insulating film being made over the side surfaces of the ridge, film deposition pressure is reduced and the film is continuously formed. With this, the film deposition rate is reduced over a potion of the grooves near the ridge and the insulating film is formed over the grooves with a smaller thickness than over the surface of the nitride semiconductor layer. When completed, the insulating film is formed at 200 nm over the surface of the nitride semiconductor layer, at 150 nm over the grooves, and at 125 nm over the side surfaces of the ridge. Again, the entire surface of the wafer is covered with a photoresist, and then the photoresist is removed until the p-side electrode 40 over the ridge portion 24 is exposed. The insulating film 30 over the p-side electrode is removed, and the photoresist over the insulating film 30 is removed.

Formation of Protective Film 50

A protective film 50 made of $SiO_2$ is formed with a thickness of 0.5 μm over the insulating film and side surfaces of the nitride semiconductor layer.

Formation of p-side Pad Electrode 60

A p-side pad electrode 60 of Ni(8 nm)/Pd(200 nm)/Au(800 nm) is formed over the insulating film 50 and p-side electrode 40.

Formation of n-side Electrode 70

The substrate is polished to the thickness of 80 μm and an n-side electrode 70 of V(10 nm)/Pt(200 nm)/Au(300 nm) is formed on the polished surface.

Cleaving

Thereafter, the substrate 10 is cleaved to form bars and resonator surfaces are formed on the cleaved surfaces of the bars. A mirror is formed with a multilayer structure made of $SiO_2/ZrO_2$ on the resonator surfaces and the bar-shaped wafers are cut perpendicular to the resonator surfaces to obtain laser chips.

Evaluation

The electrodes on each of the semiconductor laser chips thus obtained are wire bonded and the laser oscillation is tested at room temperature. The desired optical confinement is realized, and continuous oscillation with an oscillation with wavelength of 488 nm at a threshold current density of 3 kA/cm² at room temperature is confirmed. Also, a long operating life of over 1000 hours without detachment of the insulating layer is confirmed.

EXAMPLE 2

The semiconductor laser device of the present example has substantially the same configuration as in Example 1, except that the cross sectional shape of the grooves is, as shown in FIG. 2, made up of curved surfaces. According to the method of the present example, after growing the nitride semiconductor layer, grooves of 30 nm are formed by way of RIE (reactive ion etching) using a mask of the insulating film made of $SiO_2$ which is formed as in Example 1. Then, etching of 0.74 μm is carried out at a lower etching pressure to form a stripe-shaped ridge 24 of 2.0 μm in width. Other than above, the nitride semiconductor laser device can be manufactured in substantially the same manner as in Example 1. Thus, the ridge is formed retaining the shape of the previously formed grooves, so that the grooves 25 having a cross sectional shape made up of curved surfaces are formed. With the nitride semiconductor laser devices of the present example, approximately the same effects as in Example 1 can be obtained, and further, manufacturing variation can be reduced and the yield in groove-forming step can be improved.

EXAMPLE 3

The semiconductor laser device according to the present example has substantially the same configuration as in Example 2, except the method of forming the grooves. In the present example, after forming the ridge, the etching pressure is increased and the nitride semiconductor layer at both sides of the ridge is etched by 30 nm to form the grooves. Other than above, the nitride semiconductor laser device can be manufactured in substantially the same manner as in Example 2. With the nitride semiconductor laser devices of the present example, approximately the same effects as in Example 2 can be obtained.

EXAMPLE 4

The semiconductor laser device of the present example has substantially the same configuration as in Example 1, except that the cross sectional shape of the grooves is approximately rectangular, as shown in FIG. 3. In the present example, the nitride semiconductor laser device can be manufactured in substantially the same manner as in Example 1 except that the grooves are formed at a higher RF power than in Example 1. With the nitride semiconductor laser devices of the present example, approximately the same effects as in Example 1 can be obtained.

EXAMPLE 5

The semiconductor laser device of the present example has substantially the same configuration as in Example 1, except that the bottom surface of the grooves is positioned in the layer ($In_{0.04}Ga_{0.96}N$ layer formed with a thickness of 70 nm) in contact with the second semiconductor layer side of the well layer. In this case, the height of the ridge is made to be 0.74 μm and the depth of the grooves is made to be 60 nm. According to the present example, lateral optical confinement can be enhanced compared with that in Example 1, so that it is confirmed that the obtained nitride semiconductor laser device has a lower threshold value.

EXAMPLE 6

The semiconductor laser device of the present example has substantially the same configuration as in Example 1, except that the height of the ridge is made to be 0.7 μm and the depth of the grooves is made to be 100 nm. In the present example, the height of the ridge is increased but the depth of the grooves is increased, so that the same effect as in Example 1 can be obtained.

EXAMPLE 7

The semiconductor laser device according to the present example has substantially the same configuration as in Example 1, except the method of forming the insulating film above the grooves. In the present example, the nitride semiconductor laser device can be manufactured in substantially the same manner as in Example 1 except that the RF power is increased instead of decreasing the film forming pressure when forming the insulating film. With the nitride semiconductor laser devices of the present example, approximately the same effects as in Example 1 can be obtained.

EXAMPLE 8

The semiconductor laser device of the present example has substantially the same configuration as in Example 1, except that the insulating film is formed with a thickness of 60 nm over the grooves and of 100 nm over the surface of the nitride semiconductor layer. In the present example, a nitride semiconductor laser device having better heat dissipation properties than in Example 1 can be obtained.

EXAMPLE 9

The semiconductor laser device of the present example has substantially the same configuration as in Example 1, except that the insulating layer is made of $ZrO_2$. With the nitride semiconductor laser devices of the present example, approximately the same effects as in Example 1 can be obtained.

EXAMPLE 10

The semiconductor laser device of the present example has substantially the same configuration as in Example 1, except that the well layer is made of $In_{0.25}Ga_{0.75}N$ and the oscillation wavelength of the laser device is 505 nm. In the nitride semiconductor laser device according to the present example, the oscillation wavelength becomes longer compared to that in Example 1. Although optical confinement becomes difficult to obtain at a longer oscillation wavelength, good optical confinement can be achieved in the nitride semiconductor laser device of the present example, and approximately the same effects as in Example 1 can be obtained.

EXAMPLE 11

The semiconductor laser device of the present example has substantially the same configuration as in Example 1, except that the structure of the second nitride semiconductor layer and the p-side electrode 40 are different from that in Example 1. Specifically, as the second nitride semiconductor layer, AlGaN doped with Mg is grown at 10 nm, then $Cp_2Mg$ is stopped and undoped AlGaN is grown with a thickness of 150 nm, and then using $Cp_2Mg$, AlGaN doped with Mg is grown with a thickness of 450 nm. Next, GaN doped with Mg is grown at 15 nm. After forming the ridge 24 and the grooves 25, using the same method as in Example 1, ITO is formed with a thickness of 400 nm. In the nitride semiconductor laser device of the present example obtained as described above, the second nitride semiconductor layer is formed with a smaller thickness compared to that in Example 1, so that the contact resistance is reduced and power consumption becomes small, and the nitride semiconductor laser device with a long operating life can be obtained.

EXAMPLE 12

The semiconductor laser device of the present example has substantially the same configuration as in Example 1, except that the width of the ridge 24 is made to be 5.0 µm. In the nitride semiconductor laser device according to the present example, good optical confinement can be achieved as in Example 1 and approximately the same effects as in Example 1 can be obtained, and the nitride semiconductor laser device having higher power output compared to that in Example 1 can be obtained.

COMPARATIVE EXAMPLE 1

The semiconductor laser device of the present example has substantially the same configuration as in Example 1, except that the grooves are not formed. In the present comparative example, it is confirmed that the threshold current is higher and the life characteristics is inferior compared with the laser device of Example 1. This is due to weak lateral optical confinement.

COMPARATIVE EXAMPLE 2

The semiconductor laser device of the present example has substantially the same configuration as in Example 1, except that although the grooves are formed as in Example 1, the thickness of the insulating film from the side surfaces of the ridge to the surface of the nitride semiconductor layer is uniform. The insulating film is made with a thickness of 200 nm. In the present comparative example, laser devices of unstable current-voltage characteristics compared with the laser devices according to Example 1 are noted. This is due to occurrence of detachment and/or cracks in the insulating film.

The present invention can provide a nitride semiconductor laser device of a low threshold and having a long operating life in which good optical confinement is attained, adhesion of the protective film to both sides of the ridge is secured, and the optical output power versus input current is improved.

The present invention can be widely applied not only to a nitride semiconductor device which requires reliable adhesion between a film made of the same material as an embedded film and a material of the electrode, but also to a laser diode (LD), but also to a light emitting device such as a light emitting diode (LED), a super luminescence diode, a light receiving device such as a solar battery and an optical sensor, an electric device such as transistor, a power device, and the like. In particular, the present invention can be applied to a nitride semiconductor laser device used in optical disk appliances, optical communication systems, displays, printers, exposure applications, measurements, bio-related excitation light sources, and the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A nitride semiconductor laser device comprising:
   a substrate; and
   a nitride semiconductor layer having a first nitride semiconductor layer, an active layer, and a second nitride semiconductor layer stacked in this order on the substrate so that a ridge is formed by a part of the second nitride semiconductor layer, the nitride semiconductor layer being arranged so that the nitride laser device emits laser beam having a wavelength of about 440 nm or more,
   a surface of the second nitride semiconductor layer other than the ridge including a generally flat part and first and second grooves which extend along the ridge in a resonator direction, the first groove being formed continuous to a first side surface of the ridge, the second groove being formed continuous to a second side surface of the ridge which is opposite to the first side surface,
   the generally flat part of the surface of the second nitride semiconductor layer being disposed at a level higher than a bottom surface of each of the first and second grooves and lower than a top surface of the part of the second nitride semiconductor layer defining the ridge as measured from the substrate, and
   the bottom surface of each of the first and second grooves being positioned in the second nitride semiconductor layer.

2. The nitride semiconductor laser device according to claim 1, wherein
   a width of each of the first and second grooves is less than a width of the ridge.

3. The nitride semiconductor laser device according to claim 1, wherein
   a width of each of the first and second grooves is larger than a depth from the generally flat part of the surface of the nitride semiconductor layer to a bottom surface of each of the first and second grooves.

4. The nitride semiconductor laser device according to claim 1, wherein
   the active layer has a quantum well structure, and
   a bottom surface of each of the first and second grooves is positioned in a layer being in contact with a second nitride semiconductor layer side of a well layer.

5. The nitride semiconductor laser device according to claim 1, wherein a side surface of each of the first and second grooves which faces the ridge has an inclination angle smaller than an inclination angle of each of the first and second side surfaces of the ridge with respect to the generally flat part of the surface of the nitride semiconductor layer.

6. The nitride semiconductor laser device according to claim 1, further comprising
an insulating film formed on the surface of the second nitride semiconductor layer and on the first and second side surfaces of the ridge with a thickness of the insulating film being smaller on the first and second grooves than on the generally flat part of the surface of the nitride semiconductor layer.

7. The nitride semiconductor laser device according to claim 1, further comprising
an insulating film formed on the surface of the second nitride semiconductor layer and on the first and second side surfaces of the ridge, with a thickness of the insulating film on each of the first and second grooves is larger than a depth from the generally flat part of the surface of the nitride semiconductor layer to a bottom surface of each of the first and second grooves.

8. The nitride semiconductor laser device according to claim 2, wherein
a width of each of the first and second grooves is from 0.5 to 5 μm and a depth of each of the first and second grooves is from 10 to 100 nm.

9. The nitride semiconductor laser device according to claim 3, further comprising
an insulating film formed on the surface of the second nitride semiconductor layer and on the first and second side surfaces of the ridge with the largest thickness of the insulating film being from 50 to 400 nm, and a thickness of the insulating film over each of the first and second grooves being from 40 to 300 nm.

10. The nitride semiconductor laser device according to claim 1, wherein
the active layer includes a mixed crystal having In.

11. The nitride semiconductor laser device according to claim 1, wherein
the active layer includes a mixed crystal InGaN, and
at least one of the first nitride semiconductor layer and the second nitride semiconductor layer includes AlGaN.

12. The nitride semiconductor laser device according to claim 1, wherein
each of the first and second grooves has a curved surface.

13. The nitride semiconductor laser device according to claim 1, further comprising
an insulating film formed on the surface of the second nitride semiconductor layer and on the first and second side surfaces of the ridge, with the insulating film being made of $ZrO_2$.

14. The nitride semiconductor laser device according to claim 1, further comprising
an electrode layer formed on the top surface of the part of the second nitride semiconductor layer defining the ridge, with the electrode layer including ITO.

15. The nitride semiconductor laser device according to claim 1, wherein
the generally flat part of the surface of the second nitride semiconductor layer is not disposed between the ridge and each of the first and second grooves.

16. The nitride semiconductor laser device according to claim 1, further comprising
an insulating film formed on the surface of the second nitride semiconductor layer and on the first and second side surfaces of the ridge,
an interface between the insulating film and the generally flat part of the surface of the second nitride semiconductor layer is disposed at a level higher than an interface between the insulating film and the bottom surface of each of the first and second grooves and lower than the top surface of the part of the second nitride semiconductor layer defining the ridge as measured from the substrate.

* * * * *